United States Patent
Yokota et al.

(10) Patent No.: US 7,977,401 B2
(45) Date of Patent: Jul. 12, 2011

(54) ULTRAVIOLET-CURABLE RESIN COMPOSITION CONTAINING A POLYFUNCTIONAL OXETANYL GROUP

(75) Inventors: Kouichi Yokota, Osaka (JP); Koujirou Tanaka, Osaka (JP); Kai-Uwe Gaudl, Hohen Nevendorf (DE); Artur Lachowicz, Berlin (DE)

(73) Assignee: DIC Corporation, Tokyo (JP)

( * ) Notice: Subject to any disclaimer, the term of this patent is extended or adjusted under 35 U.S.C. 154(b) by 231 days.

(21) Appl. No.: 12/225,161

(22) PCT Filed: Mar. 29, 2007

(86) PCT No.: PCT/JP2007/056782
§ 371 (c)(1), (2), (4) Date: Sep. 16, 2008

(87) PCT Pub. No.: WO2007/119582
PCT Pub. Date: Oct. 25, 2007

(65) Prior Publication Data
US 2009/0209677 A1    Aug. 20, 2009

(30) Foreign Application Priority Data
Mar. 31, 2006 (JP) .................. 2006-097461

(51) Int. Cl.
C08G 65/18 (2006.01)
C08G 18/10 (2006.01)
C08G 18/77 (2006.01)

(52) U.S. Cl. .............. 522/168; 522/31; 522/32; 528/59; 528/73

(58) Field of Classification Search .................. 522/168, 522/31, 32; 528/59, 73
See application file for complete search history.

(56) References Cited

U.S. PATENT DOCUMENTS
2006/0252911 A1* 11/2006 Takenaka et al. ............. 528/420

FOREIGN PATENT DOCUMENTS
| JP | 09-087357 | 3/1997 |
| JP | 2001-246706 | 9/2001 |
| JP | 2004-137468 | 5/2004 |
| JP | 2005-146253 | 6/2005 |
| JP | 2005-227367 | 8/2005 |
| JP | 2006-299148 | 11/2006 |

* cited by examiner

OTHER PUBLICATIONS

Machine translation of JP 1997-087357; Yokoshima Minoru, Mar. 31, 1997.* International Search Report mailed May 1, 2007, issued on PCT/JP2007/056782.

*Primary Examiner* — Mark Eashoo
*Assistant Examiner* — Jessica Paul
(74) *Attorney, Agent, or Firm* — Edwards Angell Palmer & Dodge LLP

(57) ABSTRACT

An ultraviolet curable resin composition, which comprises a cationic photopolymerization initiator (B) and a urethane prepolymer (A) having a structure represented by the general formula (1);

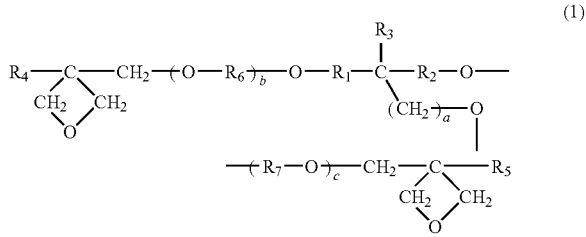

(wherein $R_1$ and $R_2$ each independently represent an alkylene group, $R_3$, $R_4$ and $R_5$ each independently represent an alkyl group or hydrogen atom, $R_6$ and $R_7$ each independently represent an alkylene group having 2 to 4 carbon atoms, a represents 0 or 1, and b and c each independently represent an integer of 0 to 10).

14 Claims, 2 Drawing Sheets

ULTRAVIOLET-CURABLE RESIN COMPOSITION CONTAINING A POLYFUNCTIONAL OXETANYL GROUP

TECHNICAL FIELD

The present invention relates to an ultraviolet curable resin composition which is applicable to various fields such as adhesives field.

BACKGROUND ART

An ultraviolet curable resin composition can be cured to form a cured product due to the irradiation of ultraviolet rays without a heating process in general. Accordingly, in recent years, an ultraviolet curable resin composition has been noted as a material, for example, which can be developed into use for a surface coating, an adhesive and the like for electronic members, plastics base materials and the like, which are easily damaged by heating.

The ultraviolet curable resin composition is roughly classified into a radically polymerizable resin composition and an ionic polymerizable resin composition.

As the radically polymerizable ultraviolet curable resin composition, a resin composition which contains a compound having a polymerizable unsaturated double bond and a radical polymerization initiator, for example, has been known.

However, when a radical polymerization of the aforementioned ultraviolet curable resin composition is conducted, the curing of the resin composition may stop on occasion before the curing proceeds sufficiently because of a cessation reaction between radicals or radical deactivation caused by the influence of oxygen in the atmosphere.

On the other hand, as the ionic polymerizable ultraviolet curable resin composition, it is known that there are a cationic-polymerizable resin composition, wherein active species at the time of polymerization is a cation, and an anionic-polymerizable resin composition, wherein active species at the time of polymerization is an anion.

The ionic polymerization is not a curing reaction which is caused by a radical. Accordingly, neither the aforementioned cessation reaction between radicals nor the radical deactivation are caused, and the ionic polymerization can proceed successively even when exposure to ultraviolet rays is stopped in the middle of a polymerization of an ionic polymerizable ultraviolet curable composition.

Therefore, the ionic-polymerizable ultraviolet curable resin composition is expected to be used as a material which can be adopted in a case wherein continuous exposure to ultraviolet rays which are required for almost complete polymerization of a resin composition is difficult. For example, the ionic-polymerizable ultraviolet curable resin composition is expected to be used as an adhesive material usable for adhering an opaque base material.

As the ionic-polymerizable ultraviolet curable resin composition, such a composition which includes a urethane resin and a photopolymerization initiator has been examined. Although the degree thereof varies in accordance with the composition of each urethane resin, many urethane resins have a level of flexibility such that, for example, when such a urethane resin is used for an adhesive, the adhesive can bedeformed to some extent in accordance with deformation of a substrate adhered to by the adhesive.

Therefore, if it becomes possible to cure a urethane resin by ionic polymerization, it is possible to provide an adhesive, a coating and the like which have high added value such that a cured product, excellent in flexibility and the like, are formed without a heating step.

As the ionic-polymerizable ultraviolet curable resin composition including a urethane resin, for example, a cationic-photopolymerizable resin composition has been known which comprises; a polyurethane resin having an oxetanyl group at the terminal end thereof; an acrylic resin having a hydroxyl group and an alicyclic epoxy group as the side chain thereof; a compound having an oxetanyl group; an alicyclic epoxy resin; and a cationic-polymerization initiator (for examples, refer to the Patent Document 1).

However, it is hard to say that the aforementioned ionic-polymerizable ultraviolet curable resin composition has sufficient curability for practical use, since there is a case that a cationic polymerization of the resin composition cannot proceed sufficiently even when ultraviolet rays are irradiated in an amount that it is sufficient in general. Such a cured product wherein a cationic polymerization proceeds insufficiently has problems such that the cured product is easily eroded by organic solvents or the like.

As described above, such an ultraviolet curable resin composition including a urethane resin has not yet been found wherein a cationic polymerization thereof can fully proceed by ultraviolet exposure, and the ultraviolet curable resin composition can form a cured product which has excellent flexibility on a level which can follow modification, such as a bend or the like, of various substrates.

Patent Document 1: Japanese Unexamined Patent Application Publication No. 2001-246706

DISCLOSURE OF INVENTION

The object to be achieved by the present invention is to provide a cationic-polymerizable ultraviolet curable resin composition which is excellent in curability and can form a cured product excellent in flexibility.

The inventors of the present invention thought that, since it is important to proceed a cationic polymerization sufficiently in order to achieve excellent curability, it may achieve the aforementioned object by increasing the amount of a cationic-polymerizable group introduced, wherein the cationic-polymerizable group directly concerns a cationic polymerization, in a urethane prepolymer.

Concretely, the inventors studied a composition which includes a cationic-photopolymerization initiator and a polyurethane resin having three or more oxetanyl groups as a cationic polymerizable group, wherein the polyurethane resin is obtained by the reaction between a polyurethane resin having three or more isocyanate groups and 3-ethyl-3-hydroxy methyl oxetane which is one of typical oxetane compounds. However, even when the aforementioned composition was used, sufficient level of curability was still not achieved, and coating performance tended to deteriorate since the viscosity of the composition increased as the number of oxetanyl groups increased.

Then, they further proceeded with the examinations based on the prospect that if various reactive diluents, such as an alicyclic epoxy compound having a cationic-polymerizable-group, are used in combination with the aforementioned polyurethane resin and the cationic polymerization initiator, a cationic polymerization might accelerate without deterioration of coating performance, and as the result, the curability of the composition might be improved.

However, even by the method wherein such a reactive diluent was used in combination, it was still difficult to increase the curability of the composition to a level sufficient for practical use.

The inventors of the present invention further proceeded with the examinations of combinations of various cationic photopolymerization initiators and various urethane prepolymers having various structures, and as a result, they found that when a resin composition including a cationic photopolymerization initiator and a urethane prepolymer described below, which has a specific structure containing an oxetanyl group, are used, it is possible to control coating performance, to greatly improve curability thereof, and to form a cured product which has excellent flexibility.

MEANS FOR SOLVING THE PROBLEMS

That is, the present invention relates to an ultraviolet curable resin composition which comprises a urethane prepolymer (A) which has the structure represented by the general formula (1) and a cationic-photopolymerization initiator (B).

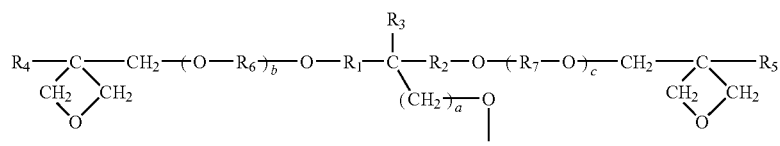

(1)

($R_1$ and $R_2$ each independently represent an alkylene group; $R_3$, $R_4$, and $R_5$ each independently represent an alkyl group or a hydrogen atom; $R_6$ and $R_7$ each independently represent an alkylene group having 2 to 4 carbon atoms; a represents 0 or 1; and b and c each independently represent an integer of 0 to 10.)

EFFECTS OF THE INVENTION

The ultraviolet curable resin composition of the present invention has excellent curability, and can form a cured product having an excellent level of flexibility which can follow deformation such as a bend of a substrate. Furthermore, the ultraviolet curable resin composition can have an excellent adhesiveness to a substrate. Accordingly, the ultraviolet curable resin composition of the present invention has very high utility value for practical use. The ultraviolet curable resin composition of the present invention can be used in various fields such as fields of; various adhesives and pressure sensitive adhesives, such as an adhesive usable for optical components; various sealing agents such as a sealing agent usable on liquid crystals; various resists such as a dry film resist and a liquid resist usable for a printed wiring board; various coating agents such as a coating agent for a release paper, a coating agent for optical discs, a coating agent for a can and a surface-coating agent for an artificial leather and a synthetic leather; and various vehicles for inks such as planographic ink, screen ink, flexo ink, gravure ink and jet ink.

BEST MODE FOR CARRYING OUT THE INVENTION

Figure 1:
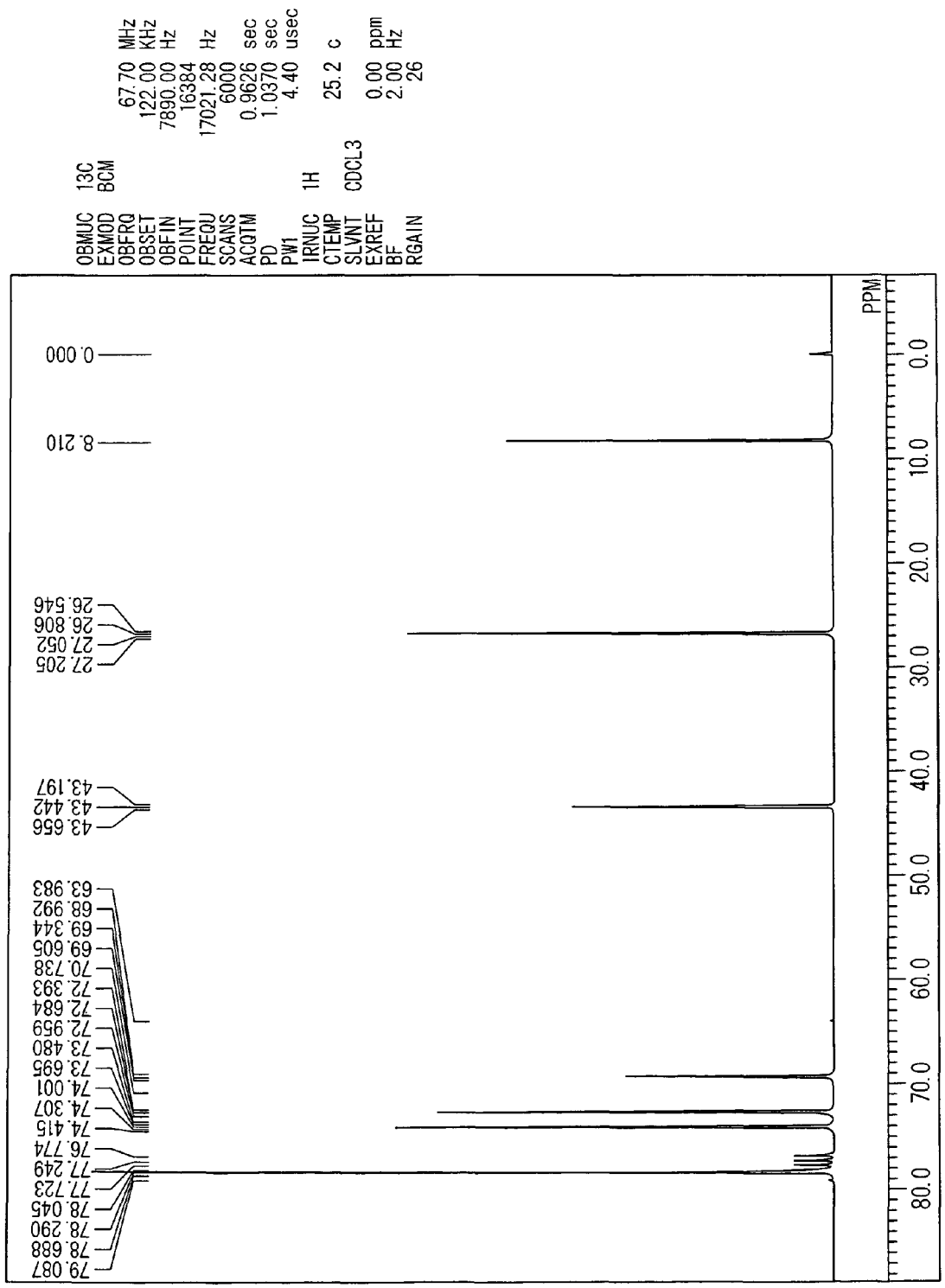
FIG. 1 is a figure wherein 1,3-bis-(3-ethyl-oxetane-3-yl-methoxy)-propane-2-ol obtained by Synthetic Example 1 was evaluated by C-NMR.

The present invention relates to an ultraviolet curable resin composition which comprises a urethane prepolymer (A) which has the structure represented by the following general formula (1) and a cationic-photopolymerization initiator (B) as a main component, and furthermore can contain various additives optionally.

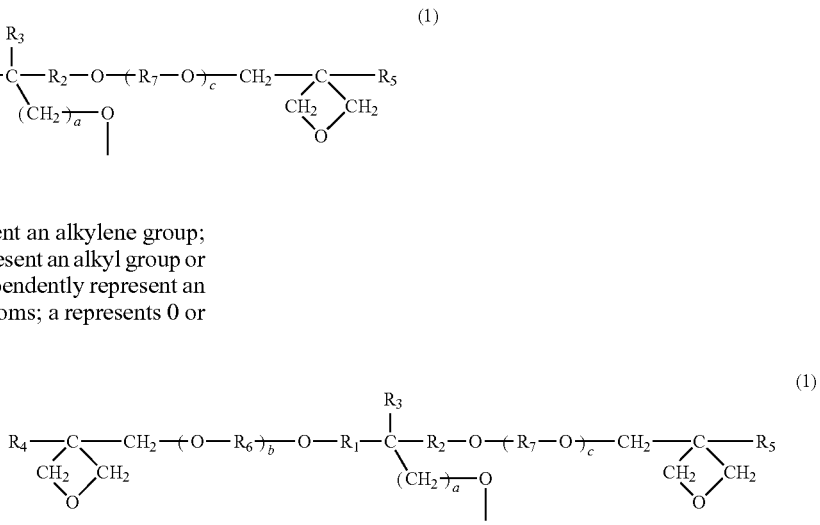

(1)

($R_1$ and $R_2$ each independently represent an alkylene group; $R_3$, $R_4$, and $R_5$ each independently represent an alkyl group or a hydrogen atom; $R_6$ and $R_7$ each independently represent an alkylene group having 2 to 4 carbon atoms; a represents 0 or 1; and b and c each independently represent an integer of 0 to 10.)

First, a urethane prepolymer (A) which has the aforementioned structure represented by the general formula (1) is explained below.

The urethane prepolymer (A) used in the present invention has the structure represented by the general formula (1) in the molecule thereof. The effects of the urethane prepolymer (A) is not obtained if the prepolymer merely has an oxetanyl group which has been already known as a cationic-polymerizable group. It is important for the prepolymer to have a specific structure having the oxetanyl group which is represented by the general formula (1), in order to obtain the ultraviolet curable resin composition of the present invention which has excellent curability and can provide an excellent cured product excellent in flexibility.

For example, even if an ultraviolet curable resin composition which includes a cationic-photopolymerization initiator and a urethane prepolymer having an oxetanyl group, wherein said prepolymer is obtained by reacting a urethane prepolymer having an isocyanate group and 3-ethyl-3-hydroxy methyl oxetane but the prepolymer does not have the aforementioned specific structure of the present invention, is sufficiently irradiated with ultraviolet rays, the irradiated resin composition cannot achieve curability equal to the level of the ultraviolet curable resin composition of the present invention.

As the urethane prepolymer (A), any prepolymer can be used in so far as the prepolymer has the structure represented by the general formula (1) in any position of the molecule thereof, and the number of the structure included in the urethane prepolymer (A) is not limited. Among them, it is preferable to use a urethane prepolymer having the structure represented by the general formula (A) at the both terminal ends of the molecule thereof, in order to obtain an excellent ultraviolet curable resin composition which has excellent curability and can provide a cured product excellent in flexibility.

The structure represented by the general formula (1) is the structure wherein each oxetanyl group is included in each molecule chain part which has two ether linkages bonding to one carbon atom.

a shown in the structure represented by the general formula (1) is 0 or 1, and is preferably 0.

Moreover, b and c shown in the structure represented by the general formula (1) are independently an integer of 0 to 10, preferably an integer of 0 to 4, and are more preferably 0.

$R_1$ and $R_2$ in the structure represented by the general formula (1) each independently represent an alkylene group such as a methylene group, an ethylene group and a propylene group, and it is preferable that $R_1$ and/or $R_2$ represent a methylene group.

$R_3$, $R_4$, and $R_5$ in the structure represented by the general formula (1) each independently represent an alkyl group or a hydrogen atom. Examples of the alkyl groups include a methyl group, an ethyl group and a propyl group.

$R_6$ and $R_7$ in the structure represented by the general formula (1) each independently represent an alkylene group having 2 to 4 carbon atoms, and concrete examples thereof include an ethylene group, a propylene group and a butylene group.

It is preferable that the structure represented by the general formula (1) has a structure such that a represents 0, b and c represent an integer of 0 to 4, $R_1$ and $R_2$ represent a methylene group, $R_3$ represents a hydrogen atom, $R_4$ and $R_5$ represent an ethyl group and $R_6$ and $R_7$ each independently represent an alkylene group having 2 to 4 carbon atoms, as shown concretely in the general formula (3).

The existing amount of the structure represented by the general formula (1) in the urethane prepolymer (A) is preferably in the range of 250 to 50000 equivalent, more preferably 350 to 35000 equivalent, and still more preferably 500 to 25000 equivalent, wherein the equivalent is determined based on polymer molecular weight of the urethane prepolymer (A) and the number of the structure represented by the general formula (1) included in the urethane prepolymer (A).

Many prepolymers called urethane prepolymers have comparatively low molecular weight in general. However, a compound having the number average molecular weight of several tens of thousands is also called a urethane prepolymer by a person with ordinary skill in the art. Said compound having the number average molecular weight of several tens of thousands can be used as the urethane prepolymer (A) in the present invention. It is preferable that the number average molecular weight of the urethane prepolymer (A) used in the present invention, wherein the measurement is performed with the Size Exclusion Chromatography, is in the range of 500 to 100000, more preferably 750 to 75000 and still more preferably 1000 to 50000. When a urethane prepolymer (A) which has the number average molecular weight within the above range is used for manufacturing the ultraviolet curable resin composition of the present invention, it is comparatively easy to adjust the viscosity of the ultraviolet curable resin composition. Accordingly, the resin composition of the present invention can not only improve the operational performance at the time of coating a resin composition on a substrate, but can also achieve excellent adhesion to an organic or inorganic substrate and excellent flexibility of a level which can follow deformation, such as a bend, of a substrate. Here, the number average molecular weight described in the present invention is the value determined with an RI detector (refraction method) on the condition of a flow rate of 1 ml/min, tetrahydrofuran is used as an eluent and

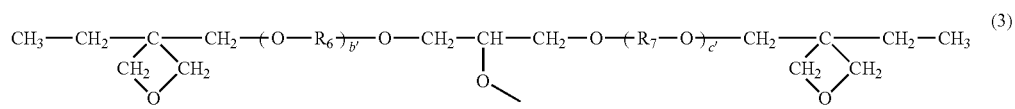

(3)

(In the general formula (3), $R_6$ and $R_7$ each independently represent an alkylene group having 2 to 4 carbon atoms, and b' and c' each independently represent an integer of 0 to 4.)

It is particularly preferable that the structure represented by the general formula (1) has the structure shown by the general formula (4), wherein all of a, b and c represent 0, $R_1$ and $R_2$ represent a methylene group, $R_3$ represents a hydrogen atom and $R_4$ and $R_5$ represent an ethyl group. When the urethane prepolymer represented by the general formula (4) is manufactured, it is hard to generate an aggregate. Furthermore, when the urethane prepolymer represented by the general formula (4) is used, an ultraviolet curable resin composition which can achieve excellent curability and excellent flexibility can be obtained.

conversion is conducted based on polystyrene standard wherein the molecular weight is known in advance. wherein the molecular weight is known in advance.

The manufacturing method of the urethane prepolymer (A) is not limited in particular. For example, the urethane prepolymer (A) can be manufactured such that a urethane prepolymer (a) having an isocyanate group at the terminal end thereof is produced by reacting polyol (a1) with polyisocyanate (a2) under the conditions such that an isocyanate group of the polyisocyanate (a2) exists in excess with respect to a hydroxyl group of the polyol (a1), and then the isocyanate group of the urethane prepolymer (a) is reacted with a hydroxyl group of a compound (b) represented by the following general formula (2).

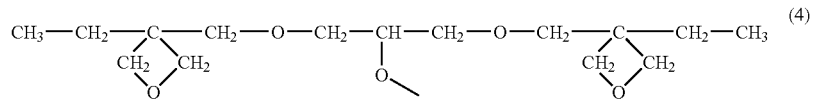

(4)

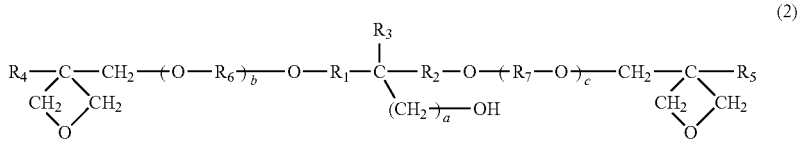

(2)

($R_1$ and $R_2$ each independently represent an alkylene group; $R_3$, $R_4$ and $R_5$ each independently represent an alkyl group or a hydrogen atom; $R_6$ and $R_7$ each independently represent an alkylene group having 2 to 4 carbon atoms; a represents 0 or 1; and b and c each independently represent an integer of 0 to 10.)

The aforementioned polyol (a1) which can be used for manufacturing the urethane prepolymer (A) is not limited and can be selected if necessary. Examples thereof include polyether polyol, polyester polyol, polycarbonate polyol and polyol wherein a principal chain thereof consists of a "carbon atom-carbon atom" bond. These polyols may be used singly or in a combination of two or more.

The polyether polyol which can be used as the polyol (a1) is not limited in particular and can be selected if necessary. Examples thereof include a compound which can be obtained by reacting alkylene oxide with a reaction initiator which comprises two or more groups having active hydrogen in the molecule thereof.

The reaction initiator is not limited in particular. Examples thereof include water, ethylene glycol, propylene glycol, butanediol, glycerol, trimethylol propane, hexane triol, triethanolamine, diglycerin, pentaerythritol, methyl glucoside, sorbitol, saccharose, an aliphatic amine compound, an aromatic amine compound, a saccharose amine compound, phosphoric acid and acidic phosphate. They can be used singly or in a combination of two or more.

The alkylene oxide is not limited in particular and can be selected if necessary. Examples thereof include ethylene oxide, propylene oxide, butylene oxide and tetrahydrofuran. They can be used singly or in a combination of two or more.

Concrete examples of the aforementioned polyether polyol, which is obtained by reacting alkylene oxide with a reaction initiator which comprises two or more groups having active hydrogen in the molecule thereof, include polypropylene glycol, polyethylene glycol, polybutylene glycol and copolymers thereof.

Furthermore, in addition to the aforementioned examples of polyether polyol, examples of the aforementioned polyether polyol further include polytetramethylene glycol which is obtained by a ring-opening polymerization of tetrahydrofuran, urethane modified polyether polyol, polyether ester copolymer polyol, polyether polyol which is obtained by conducting graft polymerization of a monomer containing a vinyl group such as a styrene monomer and an acrylonitrile monomer within various polyols (said polyether polyols are called polymer polyol in general) and polyol wherein polyurea is dispersing stably within various polyols (said polyol is called a PHD polyol in general. PHD stands for polyharnsstoff dispersion). They can be used singly or in a combination of two or more.

The polyester polyol used as the polyol (a1) is not limited in particular and can be selected if necessary. Examples thereof include polyester polyol, which is obtained by reacting low-molecular-weight polyol and polycarboxylic acid, and polyester polyol which is obtained by a ring opening polymerization of a cyclic ester compound.

Examples of the low-molecular-weight polyol include ethylene glycol, 1,2-propanediol, 1,3-butanediol, 1,4-butanediol, 3-methyl-1,5-pentanediol, 1,6-hexanediol, 3,3-dimethylol heptane, 1,4-cyclohexane dimethanol, neopenthyl glycol, diethylene glycol, dipropylene glycol, glycerol and trimethylol propane. They can be used singly or in a combination of two or more.

Examples of the polycarboxylic acid include a succinic acid, an adipic acid, an azelaic acid, a sebacic acid, a dodecane dicarboxylic acid, an orthophthalic acid, an isophthalic acid and a terephthalic acid. They can be used singly or in a combination of two or more.

Examples of the cyclic ester compound include ε-caprolactone and δ-valerolactone. They can be used singly or in a combination of two or more.

Examples of the polycarbonate polyol which can be used as the polyol (a1) include compounds which can be obtained by a condensation reaction between the aforementioned low-molecular-weight polyol and alkylene carbonate.

Examples of the polyol which can be used as the polyol (a1) and has a principal chain consisting of a carbon atom-carbon atom bond include polybutadiene polyol and hydrogenated polybutadiene polyol.

The polyisocyanate (a2), which can be used for manufacturing the aforementioned urethane prepolymer (A), is not limited and can be selected if necessary. Examples thereof include aromatic diisocyanates such as 4,4'-diphenylmethane diisocyanate, 2,4'-diphenylmethane diisocyanate, 2,2'-diphenylmethane diisocyanate, polymethylene polyphenyl polyisocyanate, carbodiimide modified diphenylmethane polyisocyanate, 2,4-tolylene diisocyanate, 2,6-tolylene diisocyanate and 1,5-naphthalene diisocyanate; diisocyanates wherein an isocyanate group is bonded to an aromatic ring via an alkylene group such as xylylene diisocyanate and tetramethyl xylene diisocyanate; alicyclic diisocyanates such as isophorone diisocyanate, dicyclohexylmethane diisocyanate, hydrogenated xylylene diisocyanate and norbornene diisocyanate; and aliphatic diisocyanates such as hexamethylene diisocyanate, trimethyl hexamethylene diisocyanate, lysine diisocyanate and dimer diisocyanate. They can be used singly or in a combination of two or more.

The compound (b) represented by the general formula (2), which can be used for manufacturing the urethane prepolymer (A), is a compound which includes a hydroxyl group and oxetanyl groups. The hydroxyl group can react with an isocyanate group of the urethane prepolymer (a), and each of the oxetanyl groups is bonding to each portion of a molecule chain of the compound wherein the portion has two ether linkages bonding to one carbon atom.

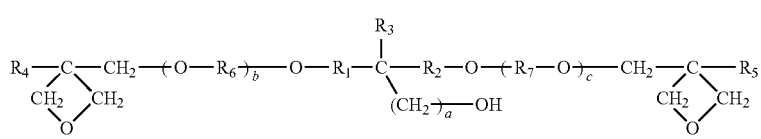

(2)

($R_1$ and $R_2$ each independently represent an alkylene group; $R_3$, $R_4$, and $R_5$ each independently represent an alkyl group or a hydrogen atom; $R_6$ and $R_7$ each independently represent an alkylene group having 2 to 4 carbon atoms; a represents 0 or 1; and b and c each independently represent an integer of 0 to 10.)

a in the compound (b) represented by the general formula (2) represents 0 or 1, and it is preferable that a represents 0. Furthermore, b and c in the compound (b) represented by the general formula (2) each independently represent an integer of 0 to 10, preferably an integer of 0 to 4, and still more preferably 0.

$R_1$ and $R_2$ in the compound (b) represented by the general formula (2) each independently represent an alkylene group such as a methylene group, an ethylene group and a propylene group, and it is preferable that $R_1$ and/or $R_2$ represent a methylene group.

$R_3$, $R_4$, and $R_5$ in the compound (b) represented by the general formula (2) each independently represent an alkyl group or a hydrogen atom. Examples of the alkyl groups include a methyl group, an ethyl group and a propyl group.

$R_6$ and $R_7$ in the compound (b) represented by the general formula (2) each independently represent an alkylene group containing 2 to 4 carbon atoms, and concrete examples thereof include an ethylene group, a propylene group and a butylene group.

Concretely, it is preferable that the compound (b) represented by the general formula (2) is a compound represented by the general formula (5), wherein, in the general formula (2), a represents 0, a and b represent an integer of 0 to 4, $R_1$ and $R_2$ represent a methylene group, $R_3$ represents a hydrogen atom, $R_4$, and $R_5$ represent an ethyl group, and $R_6$ and $R_7$ each independently represent an alkylene group containing 2 to 4 carbon atoms.

The compound (b) represented by the general formula (2) can be manufactured by various methods. For example, the compound (b) represented by the chemical formula (6) can be manufactured by mixing 3-ethyl-3-hydroxy methyl oxetane and 1-chloro-2,3-epoxy propane to react to each other in the presence of sodium hydroxide.

The compound represented by the general formula (6) can be manufactured by reacting 3-ethyl-3-hydroxy methyl oxetane and 1-chloro-2,3-epoxy propane, for example, such that they are mixed in the ratio of 2 to 10 moles of 3-ethyl-3-hydroxy methyl oxetane to 1 mole of 1-chloro-2,3-epoxy propane in a flask at a temperature of 5 to 20° C., and further stirred for 6 to 12 hours to react to each other.

In the above reaction of the 3-ethyl-3-hydroxy methyl oxetane and 1-chloro-2,3-epoxy propane, various by-products tend to generate in addition to the target compound represented by the general formula (6). Accordingly, from the viewpoint of suppressing the generation of aggregates at the time of manufacturing the urethane prepolymer (A), it is preferable that purification is conducted subsequent to the above reaction in order to remove by-products with any method such as filtration and distillation.

It is preferable that the distillation of the compound represented by the chemical formula (6) be conducted, for example, under the conditions of 140° C. or more and 20 mbar or less, and more preferably under the conditions of 150° C. or more and 0.02 mbar or less.

Among the compound represented by the general formula (5), a compound represented by the general formula (5), wherein b and c represent 1 to 4, can be manufactured by, for example, reacting 1-chloro-2,3-epoxy propane with a reactant of 3-ethyl-3-hydroxy methyl oxetane and ethylene carbonate under the presence of sodium hydroxide.

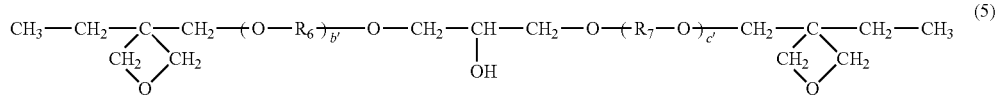

(In the general formula (5), $R_6$ and $R_7$ in the general formula (5) each independently represent an alkylene group having 2 to 4 carbon atoms; and b' and c' each independently represent an integer of 0 to 4.)

It is particularly preferable that a compound represented by the general formula (6) is used as the compound (b) represented by the general formula (2). The compound represented by the chemical formula (6) is a compound represented by the general formula (2), wherein a, b and c represents 0, $R_1$ and $R_2$ represent a methylene group, $R_3$ represents a hydrogen atom and $R_4$ and $R_5$ represent an ethyl group, that is to say, a compound represented by the general formula (5) wherein both b' and c' represent 0 (compound name: 1,3-bis(3-ethyl-oxetane-3-ylmethoxy)propane-2-ol). The compound represented by the chemical formula (6) can be easily purified from the by-product produced in the manufacturing process by a method such as distillation. When such a purified compound represented by the chemical formula (6) is used, it is possible to obtain an ultraviolet curable resin composition which can achieve excellent curability and flexibility, and hardly generates aggregates In the above reaction of 1-chloro-2,3-epoxy propane with a reactant of 3-ethyl-3-hydroxy methyl oxetane and ethylene carbonate, various by-products tend to be generate in addition to the target compound represented by the general formula (5). Accordingly, it is preferable that by-products are removed by purifying the reaction product with any method such as filtration and distillation subsequent to the above reaction, before the compound represented by the general formula (5) is used.

It is preferable that when the distillation of the reaction product, which is obtained by reacting 1-chloro-2,3-epoxy propane with a reactant of 3-ethyl-3-hydroxy methyl oxetane and ethylene carbonate, is conducted, for example, the distillation is conducted under the conditions of 140° C. or more and 20 mbar or less, and more preferably under the conditions of 150° C. or more and 0.02 mbar or less.

The manufacturing method of the urethane prepolymer (a) which has an isocyanate group at the molecule terminal end thereof and can be used for manufacturing the urethane prepolymer (A) is not limited and can be selected if necessary.

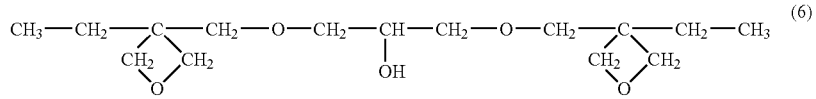

For example, the urethane prepolymer (a) can be manufactured such that the polyol (a1) and the polyisocyanate (a2) are mixed at a temperature of 70 to 100° C. at the ratio wherein the equivalent of an isocyanate group of the polyisocyanate (a2) becomes excessive with respect to the equivalent of a hydroxyl group of the polyol (a1) in a flask wherein the atmosphere is replaced with nitrogen, and stirred for about 2 to 15 hours for them to react with each other.

It is preferable that the reaction of the polyol (a1) and the polyisocyanate (a2) is conducted such that the equivalent ratio of an isocyanate group of the polyisocyanate (a2) with respect to 1 equivalent of a hydroxyl group of the polyol (a1) is in the range of 1.1 to 5.0, more preferably in the range of 1.4 to 4.0 and still more preferably 1.3 to 3.0. When the urethane prepolymer obtained by the reaction according to the above equivalent ratio is used, an ultraviolet curable resin composition which has excellent curability and can form a cured product excellent in flexibility can be obtained.

In addition to the polyol (a1) and the polyisocyanate (a2), a compound having active hydrogen which can react with an isocyanate group can be used optionally when the aforementioned urethane prepolymer (a) is manufactured.

The compound having active hydrogen is not limited and can be selected if necessary. Examples thereof include those known as a chain extension agent generally such as low-molecular-weight polyol, aliphatic amine, aromatic amine and alkanol amine.

Examples of the aforementioned low-molecular-weight polyol include those cited as examples for the low-molecular-weight polyol which can be used for manufacturing the polyester polyol.

The urethane prepolymer (A) can be manufactured such that the urethane prepolymer (a) obtained by the aforementioned manufacturing method and the compound (b) represented by the general formula (2) are stirred, for example, for 2 to 15 hours at a temperature of 70 to 100° C. in an atmosphere of nitrogen so that an isocyanate group of the urethane prepolymer (a) is reacted with a hydroxyl group of the compound (b).

It is preferable that, when the urethane prepolymer (a) is reacted with the compound (b), the equivalent ratio of an isocyanate group of the urethane prepolymer (a) with respect to 1 equivalent of a hydroxyl group of the compound (b) is in the range of 0.5 to 1.5, more preferably in the range of 0.5 to 1.2 and still more preferably 0.8 to 1.2. When the urethane prepolymer obtained by the reaction according to the above equivalent ratio is used, an ultraviolet curable resin composition, which has excellent curability and coating performance and can form a cured product excellent in flexibility, can be obtained.

Next, the cationic-photopolymerization initiator (B) used in the present invention is explained.

The cationic-photopolymerization initiator used in the present invention means a compound which can generate an acid component, which starts a cationic polymerization, due to the irradiation of ultraviolet rays. The cationic-photopolymerization initiator used in the present invention generates an acid component when ultraviolet rays are irradiated to the ultraviolet curable resin composition of the present invention, and the acid component makes a cationic polymerization of the aforementioned urethane prepolymer (A) start.

The aforementioned cationic-photopolymerization initiator is not limited and can be selected if necessary. Examples thereof include an aromatic sulfonium salt, an aromatic iodonium salt, an aromatic diazonium salt, an aromatic ammonium salt, a thioxanthonium salt and a (2,4-cyclopentadiene-1-yl)[(1-methylethyl)benzene]-iron salt, wherein the cationic moiety thereof is aromatic sulfonium, aromatic iodonium, aromatic diazonium, aromatic ammonium, thioxanthonium, (2,4-cyclopentadiene-1-yl) [(1-methylethyl)benzene]-iron cation and thianthrenium, and the anionic moiety thereof is $BF_4^-$, $PF_6^-$, $SbF_6^-$ and $[BX_4]^-$ (wherein X represents a functional group wherein two or more hydrogen atoms of a phenyl group are substituted with a fluorine atom or a trifluoromethyl group). They can be used singly or in a combination of two or more.

Examples of the aromatic sulfonium salt include bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfide bistetrafluoroborate, bis[4-(diphenylsulfonio)phenyl]sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis(pentafluorophenyl)borate, bis[4-(di(4-(2-hydroxyethoxy))phenylsulphonio)phenyl]sulfide bishexafluorophosphate, bis[4-(di(4-(2-hydroxyethoxy))phenylsulphonio)phenyl]sulfide hexafluoroantimonate, bis[4-(di(4-(2-hydroxyethoxy))phenylsulphonio)phenyl]sulfide bistetrafluoroborate and bis[4-(di(4-(2-hydroxyethoxy))phenylsulphonio)phenyl]sulfide tetrakis(pentafluorophenyl)borate.

Examples of the aromatic iodonium salt include diphenyliodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate and 4-methylphenyl-4-(1-methylethyl)phenyliodonium tetrakis(pentafluorophenyl)borate.

Examples of the aromatic diazonium salt include phenyldiazonium hexafluorophosphate, phenyldiazonium hexafluoroantimonate, phenyldiazonium tetrafluoroborate and phenyldiazonium tetrakis(pentafluorophenyl)borate.

Examples of the aromatic ammonium salt include 1-benzyl-2-cyanopyridinium hexafluorophosphate, 1-benzyl-2-cyanopyridinium hexafluoroantimonate, 1-benzyl-2-cyanopyridinium tetrafluoroborate, 1-benzyl-2-cyanopyridinium tetrakis(pentafluorophenyl)borate, 1-(naphthylmethyl)-2-cyanopyridinium hexafluorophosphate, 1-(naphthylmethyl)-2-cyanopyridinium hexafluoroantimonate, 1-(naphthylmethyl)-2-cyanopyridinium tetrafluoroborate and 1-(naphthylmethyl)-2-cyanopyridinium tetrakis(pentafluorophenyl)borate.

Examples of the thioxanthonium salt include S-biphenyl 2-isopropyl thioxanthonium hexafluorophosphate.

Moreover, examples of the aforementioned (2,4-cyclopentadiene-1-yl) [(1-methylethyl)benzene]-iron salt include (2,4-cyclopentadiene-1-yl) [(1-methylethyl)benzene]-iron (II)-hexafluorophosphate, (2,4-cyclopentadiene-1-yl) [(1-methylethyl)benzene]-iron (II)-hexafluoroantimonate, (2,4-cyclopentadiene-1-yl)[(1-methylethyl)benzene]-iron (II)-tetrafluoroborate and (2,4-cyclopentadiene-1-yl)[(1-methylethyl)benzene]-iron (II)-tetrakis(pentafluorophenyl)borate.

Commercially available cationic polymerization initiator can be used as the cationic polymerization initiator, and examples thereof include CPI-100P and CPI-101A (manufactured by San-apro.cojp); Cyracure photo-curing initiator UVI-6990, Cyracure photo-curing initiator UVI-6992 and Cyracure photo-curing initiator UVI-6976 (manufactured by Dow Chemical Japan Ltd.); ADEKA OPTOMER SP-150, ADEKA OPTOMER SP-152, ADEKA OPTOMER SP-170 and ADEKA OPTOMER SP-172 (manufactured by Asahi Denka Kogyo K.K.); CI-5102 and CI-2855 (manufactured by Nippon Soda Co., Ltd.), SUN AID SI-60L, SUN AID SI-80L SUN AID SI-100L, SUN AID SI-110L, SUN AID SI-180L, SUN AID SI-110, SUN AID SI-145, SUN AID SI-150, SUN AID SI-160 and SUN AID SI-180 (manufactured by Sanshin Chemical Industry Co., Ltd.); ESACURE 1064 and Esacure 1187 (manufactured by Lamberti Co.); Omnicat 432, Omnicat 440, Omnicat 445, Omnicat 550, Omnicat 650 and Omnicat BL-550 (manufactured by IGM resin Inc.); IRGACURE 250 (manufactured by Chiba Specialty Chemicals); and RHODORSIL PHOTOINITIATIR 2074 (manufactured by Rhodia Japan Co.).

Moreover, it is preferable for the ultraviolet curable resin composition of the present invention that a cationic-polymerizable compound (C) is also used in addition to the urethane prepolymer (A) and the cationic-photopolymerization initiator (B), in order to improve coating performance of the ultraviolet curable resin composition of the present invention.

In order to decrease viscosity of an ultraviolet curable resin composition and improve coating performance thereof, methods wherein an organic solvent is used in combination have been generally known.

However, when the ultraviolet curable resin composition including an organic solvent is used, there is a problem in that an additional step for volatilizing and removing the organic solvent included in the coated layer is necessary. Therefore, use of an organic solvent is not preferable from the viewpoint of improving working efficiency and decreasing the load to a global environment.

Therefore, the aforementioned cationic-polymerizable compound (C), which can be copolymerized with the urethane prepolymer (A) or the like to form a cured film in the film forming process, is preferably used as reactive diluent instead of an organic solvent, since coating performance of an ultraviolet curable resin composition can be improved without decreasing coating performance efficiency or increasing the load to a global environment.

The cationic-polymerizable compound (C) is not limited and can be selected if necessary. Examples of the cationic-polymerizable compound (C) include an oxetane compound which has in the molecule the oxetane ring structure represented by the general formula (7), an alicyclic epoxy compound, a bisphenol A type epoxy compound, a hydrogenated bisphenol A type epoxy compound, a bisphenol F type epoxy compound, and a glycidyl ether type epoxy compound such as an aliphatic polyol polyglycidyl ether compound. They can be used singly or in a combination of two or more. Among them, it is preferable that the oxetane compound is used as the cationic-polymerizable compound (C).

(7)

As the aforementioned oxetane compound, an oxetane compound having plural oxetane ring structures, preferably 2 to 4 oxetane ring structures, can be used.

As the oxetane compound which has 2 to 4 of the oxetane ring structures, for example, compounds represented by the following general formulae (8) and (9) can be used singly or in combination.

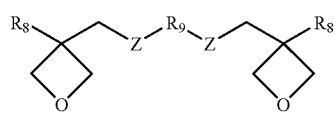
(8)

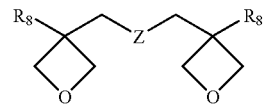
(9)

In the general formulae (8) and (9), $R_8$ represents a hydrogen atom, an alkyl group, which may be a linear, branched or cyclic groups having 1 to 6 carbon atoms, an allyl group, an aryl group, an aralkyl group, a furyl group or a thienyl group, $R_9$ represents an bivalent organic residue and Z represents an oxygen atom or a sulfur atom.

Examples of the aforementioned linear, branched or cyclic alkyl group having 1 to 6 carbon atoms shown by $R_8$ include a methyl group, an ethyl group, n- or i-propyl group, n-, i- or t-butyl group, a pentyl group, a hexyl group and a cyclohexyl group. Examples of the aryl group include a phenyl group, a naphtyl group, a tolyl group and a xylyl group, and examples of the aralkyl group include a benzyl group and a phenethyl group.

Examples of the bivalent organic residue shown by $R_8$ in the general formula (8) include a linear, branched or cyclic alkylene group, a polyoxyalkylene group having 4 to 30 carbon atoms, a phenylene group, a xylylene group and a group having the structure represented by the general formula (10) or (11).

The linear, branched or cyclic alkylene group shown by $R_9$ is preferably an alkylene group having 1 to 15 carbon atoms such as a methylene group, an ethylene group, 1,2- or 1,3-propylene group, a butylene group or a cyclohexylene group. Furthermore, the polyoxy alkylene group having 4 to 30 carbon atoms is preferably a polyoxy alkylene group having 4 to 8 carbon atoms such as a polyoxyethylene group or a polyoxypropylene group.

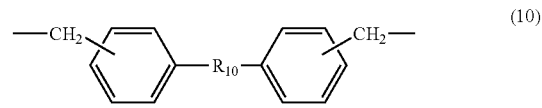
(10)

In the general formula (10), $R_{10}$ represents an oxygen atom, a sulfur atom, $CH_2$, NH, SO, $SO_2$ and $C(CF_3)_2$, or $C(CH_3)_2$.

(11)

In the general formula (11), $R_{11}$ represents an alkylene group having 1 to 6 carbon atoms, an arylene group and a functional group represented by the following general formula (12).

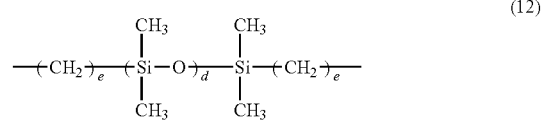
(12)

In the general formula (12), d represents an integer of 1 to 6, and e represents an integer of 1 to 15.

It is preferable that e of the general formula (12) represents an integer of 1 to 3.

As the aforementioned oxetane compound which has the 2 to 4 oxetane ring structures, for example, ARON OXETANE OXT-221 and ARON OXETANE OXT-121 (manufactured by Toagosei Co., Ltd.) and ETERNACOLL OXBP and ETERNACOLL OXTP (manufactured by Ube Industries, Ltd.) are commercially available.

As the aforementioned alicyclic epoxy compound, an alicyclic epoxy compound which has plural alicyclic epoxy groups, preferably an alicyclic epoxy compound which has 2 to 4 alicyclic epoxy groups, can be used.

Examples of the alicyclic epoxy compound which has two alicyclic epoxy groups include 3,4-epoxy cyclohexyl methyl-3,4-epoxy cyclohexane carboxylate (compound represented by the general formula (13), wherein f represent 0), a caprolactone modified compound of said carboxylate (compound represented by the general formula (13), wherein f represent 1), a trimethyl caprolactone modified compound of said carboxylate (compounds represented by the general formulae (14) and (15)), a valerolactone modified compound of said carboxylate (compounds represented by the general formulae (16) and (17)) and a compound represented by the general formula (18).

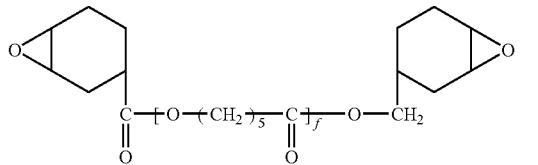

(13)

In the general formula (13), f represents 0 or 1.

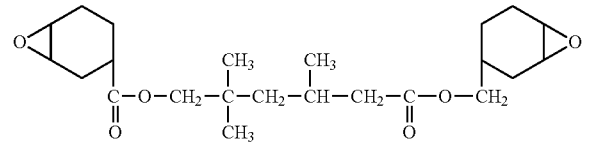

(14)

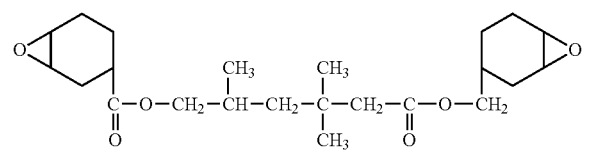

(15)

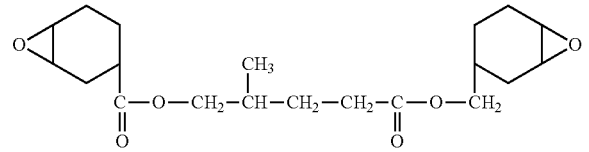

(16)

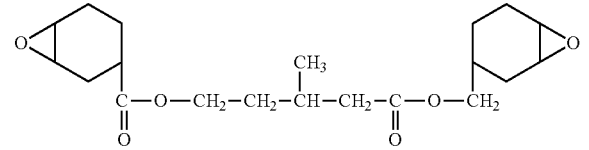

(17)

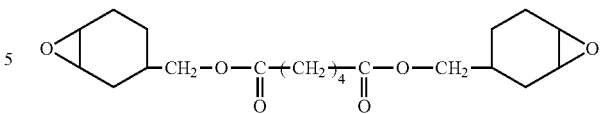

(18)

As the 3,4-epoxy cyclohexyl methyl-3,4-epoxy cyclohexane carboxylate and the caprolactone modified compound of the carboxylate, CELLOXIDE 2021, CELLOXIDE 2021A, CELLOXIDE 2021P, CELLOXIDE 2081, CELLOXIDE 2083 and CELLOXIDE 2085 (manufactured by Daicel Chemical Industries, Ltd.); CYRACURE UVR-6105, CYRACURE UVR-6107 and CYRACURE UVR-6110 (manufactured by Dow Chemical Japan Ltd.) and the like are commercially available.

Moreover, as the alicyclic epoxy compound represented by the general formula (18) which is an adipic acid ester, for example, CYRACURE LVR-6128 (manufactured by Dow Chemical Japan Ltd.) is commercially available.

As the alicyclic epoxy compound which has three alicyclic epoxy groups, a compound represented by the following general formula (19) can be used.

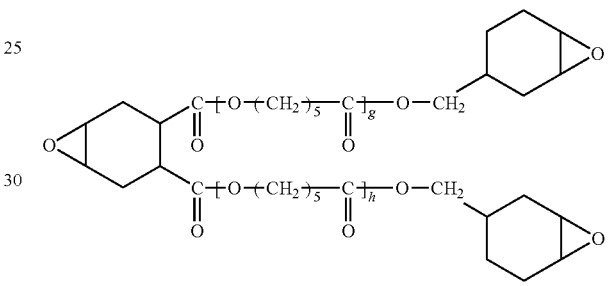

(19)

In the general formula (19), g and h each independently represent 0 or 1, and they may be the same or different each other.

As the alicyclic epoxy compound represented by the general formula (19), EPOLEAD GT301, EPOLEAD GT302 (manufactured by Daicel Chemical Industries, Ltd. make) and the like are commercially available.

As the alicyclic epoxy compound which has four alicyclic epoxy groups, a compound represented by the following general formula (20) can be used.

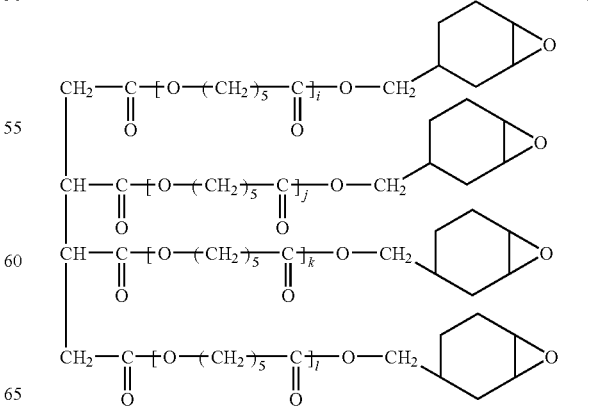

(20)

In the general formula (20), i to 1 each independently represent 0 or 1, and they may be the same or different each other.

As the alicyclic epoxy compound represented by the general formula (20), for example, EPOLEAD GT401 and EPOLEAD GT403 (manufactured by Daicel Chemical Industries, Ltd. make) and the like are commercially available.

As the bisphenol A type epoxy compound, for example, EPICLON 840, EPICLON 840-S, EPICLON 850, EPICLON 850-S, EPICLON 850-CRP and EPICLON 850-LC (manufactured by Dainippon Ink and Chemicals, Inc.); jER827, jER828, jER828EL, jER828XA and jER834 (manufactured by Japan Epoxy Resins Co., Ltd.); RIKARESIN BPO-20E and RIKARESIN BEO-60E (manufactured by New Japan Chemical Co., Ltd.) and the like are commercially available.

As the aforementioned hydrogenated bisphenol A type epoxy compound, for example, Denacol EX-252 (manufactured by Nagase ChemteX Corporation), SR-HBA (manufactured by Sakamoto Yakuhin Kogyo., Ltd.), jERYX8000, jERYX8034 (manufactured by Japan Epoxy Resins Co., Ltd.), RIKARESIN HBE-100 (manufactured by New Japan Chemical Co., Ltd.) and the like are commercially available.

As the bisphenol F type epoxy compound, for example, EPICLON 830, EPICLON 830-S, EPICLON 830-LVP, EPICLON 835 and EPICLON 835-LV (they are manufactured by Dainippon Ink and Chemicals, Inc.); jER806, iER806L and jER807 (manufactured by Japan Epoxy Resins Co., Ltd.) and the like are commercially available.

Furthermore, as the aforementioned aliphatic polyol polyglycidyl ether compound, for example, sorbitol polyglycidyl ether, polyglycerol polyglycidyl ether, pentaerythritol polyglycidyl ether, diglycerol polyglycidyl ether, glycerol polyglycidyl ether, trimethylol propane polyglycidyl ether, neopentyl glycol diglycidyl ether, 1,4-butanediol diglycidyl ether, 1,6-hexanediol diglycidyl ether, ethylene glycol diglycidyl ether, polyethylene glycol diglycidyl ether, propylene glycol diglycidyl ether, polypropylene glycol diglycidyl ether and the like can be used.

Among examples of the aliphatic polyol polyglycidyl ether compound, an aliphatic polyol polyglycidyl ether compound which has 2 to 4 epoxy groups is preferably used.

As the aliphatic polyol polyglycidyl ether compound which has 2 to 4 epoxy groups, EPICLON 703, EPICLON 705, EPICLON 707, EPICLON 720, EPICLON 725, and EPICLON 726 (manufactured by Dainippon Ink and Chemicals, Inc.); DENACOL EX-611, DENACOL EX-612, DENACOL EX-614, DENACOL EX-622, DENACOL EX-614B, DENACOL EX-512, DENACOL EX-521, DENACOL EX-411, DENACOL EX-421, DENACOL EX-313, DENACOL EX-314, DENACOL EX-321, DENACOL EX-211, DENACOL EX-212, DENACOL EX-212L, DENACOL EX-214L, DENACOL EX-810, DENACOL EX-811, DENACOL EX-850, DENACOL EX-851, DENACOL EX-821, DENACOL EX-830, DENACOL EX-832, DENACOL EX-841, DENACOL EX-861, DENACOL EX-850L, DENACOL EX-911, DENACOL EX-941, DENACOL EX-920 and DENACOL EX-931 (manufactured by Nagase ChemteX Corporation); SR-NPG, SR-16H, SR-16HL, SR-TMP, SR-PG; SR-TPGQ SR-4PG; SR-2EG; SR-8EG; SR-8EGS, SR-GLG; SR-DGE, SR-DGE, SR-4GL, SR-4GLS and SR-SEP (manufactured by Sakamoto Yakuhin Kogyo., Ltd.); and YED205, YED216 and YED216M (manufactured by Japan Epoxy Resins Co., Ltd.) and the like are commercially available.

As the cationic-polymerizable compound (C), an oxetane compound including an oxetane ring structure is preferably used, and an oxetane compound including 2 to 4 oxetane ring structures is more preferably used. Due to use of the oxetane compound including the oxetane ring structure, it is possible to improve not only the coating performance of the ultraviolet curable resin composition of the present invention but also the curability of the resin composition.

Next, the manufacturing method of the ultraviolet curable resin composition of the present invention is explained.

The ultraviolet curable resin composition of the present invention can be manufactured, for example, such that the aforementioned urethane prepolymer (A) is mixed and stirred with the cationic-polymerizable compound (C), which is added optionally, until a uniform mixture thereof is formed, and subsequently, the mixture is mixed and stirred with the aforementioned cationic-photopolymerization initiator (B).

It is preferable that the cationic-photopolymerization initiator (B) is used in the range of 0.5 to 20% by mass with respect to the total amount of ultraviolet curable resin composition of the present invention, more preferably in the range of 0.7 to 15% by mass and still more preferably in the range of 1 to 10% by mass. When the ultraviolet curable resin composition includes the cationic-photopolymerization initiator (B) in the aforementioned range, excellent curability can be achieved, and deterioration of a metal substrate caused by an acid can be prevented since the residual amount of an acid generated by the cationic-photopolymerization initiator (B) can be reduced within the cured product.

When the cationic-polymerizable compound (C) is used, it is preferable that the mass ratio ((A)/(C)) of the urethane prepolymer (A) to the cationic-polymerizable compound (C) be 90/10 to 10/90, and more preferably 80/20 to 20/80.

Various additives can be used in the ultraviolet curable resin composition of the present invention if necessary, insofar as the effects of the present invention do not deteriorate.

Examples of the above additives which can be used in the present invention include a silane coupling agent, an organic solvent, a filler, a thixotropy imparting agent, a sensitizer, aforementioned various polyols and other polyols, a leveling agent, an antioxidant, an adhesion imparting agent, wax, a heat-stabilizer, a light stabilizer, a fluorescent brightener, a foaming agent, an organic pigment, an inorganic pigment, a dye, a conductivity imparting agent, an antistatic agent, a moisture penetration improver, a water repellent, a hollow foam, a flame retardant, a water absorber, a moisture absorber, a deodorizer, a foam regulating agent, an antifoaming agent, an antifungus agent, an antiseptic agent, an antialgae agent, a pigment dispersing agent, an anti-blocking agent and a hydrolysis inhibitor, as well as water-soluble organic and/or inorganic compounds and other resins such as a thermoplastic resin, a thermosetting resin and the like.

Among the aforementioned additives, an organic solvent, a filler, a thixotropy imparting agent and a silane coupling agent described below can be cited as representative agents.

Examples of the aforementioned silane coupling agent usable in the present invention include 3-glycidoxypropyltrimethoxysilane, 3-glycidoxypropyltriethoxysilane, 3-glycidoxypropylmethyldiethoxysilane, 2-(3,4-epoxycyclohexyl)ethyltrimethoxysilane, 2-(3,4-epoxycyclohexyl)ethyltriethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-acryloxypropyltrimethoxysilane, 3-mercaptopropyltrimethoxysilane, 3-mercaptopropylmethyldimethoxysilane, vinyltrimethoxysilane, vinyltriethoxysilane, 3-chloropropyltrimethoxysilane and bis(triethoxysilylpropyl)tetrasulfide.

From the viewpoint of controlling the viscosity of the ultraviolet curable resin composition of the present invention and improving coating performance and the like of the composition, it is possible to use an organic solvent in combination as the aforementioned additives. Examples of the organic solvent usable in the present invention include: toluene, xylene, cyclohexane, ethyl acetate, butyl acetate, acetone, methyl ethyl ketone, methyl isobutyl ketone, methyl cellosolve, ethyl cellosolve, ethyl cellosolve acetate, propylene glycol methyl ether, propylene glycol methyl ether acetate, ethanol, isopropyl alcohol, 2-butanol, N,N-dimethyl formamide, cyclohexanone, N-methyl-2-pyrrolidone, dibasic acid diester and tetrachloroethylene. However, when an ultraviolet curable resin composition including an organic solvent is coated on a substrate or the like, there is a problem in that a step for volatilizing and removing the organic solvent within the coating layer is necessary. Accordingly, from the viewpoint of improving coating efficiency and decreasing the load to a global environment, it is preferable that an organic solvent is not used if it is possible.

Examples of the aforementioned filler which is usable in the present invention include calcium carbonate, aluminium hydroxide, barium sulfate, kaolin, talc, Carbon Black, alumina, magnesium oxide, inorganic and organic balloons, lithia tourmaline and activated carbon.

Examples of the aforementioned thixotropy imparting agent usable in the present invention include a surface-treated calcium carbonate, fine powder of silica, bentonite and zeolite.

The aforementioned additives can be mixed when the urethane prepolymer (A) and the cationic-polymerizable compound (C), which is added if necessary, are mixed and stirred with a sealing type planetary mixer or the like.

The cationic polymerization of the ultraviolet curable resin composition of the present invention obtained by the aforementioned method can proceed, for example, by irradiating a part of the resin composition with ultraviolet rays.

The dose of the ultraviolet rays is not limited and can be selected if necessary. For example, 50 to 5000 mJ/cm$^2$ is preferable, 100 to 3000 mJ/cm$^2$ is more preferable, and 100 to 1000 mJ/cm$^2$ is still more preferable. Since the ultraviolet curable resin composition of the present invention can be hardened sufficiently even if the dose of the ultraviolet rays is a comparatively small level, such as a does of about 100 to 1000 mJ/cm$_2$, damage of a substrate, which is caused by irradiating the large amounts of ultraviolet rays, can be prevented when the ultraviolet curable resin composition of the present invention is used. The aforementioned dose of ultraviolet rays is based on the value which is measured with a UV CHECKER UVR-N1 (manufactured by Nippon Denchi Co., Ltd.) at a wavelength range of 300 to 390 nm.

When the aforementioned ultraviolet rays are irradiated, a conventional lamp such as a xenon lamp, a xenon-mercury lamp, a metal halide lamp, a high-pressure mercury lamp and a low-pressure mercury lamp can be used.

The ultraviolet curable resin composition of the present invention can be used, for example, for a coating agent, an adhesive, a molding material or the like.

When the ultraviolet curable resin composition of the present invention is used as a coating agent, a film can be formed by a method wherein the resin composition is coated at the thickness of 2 to 50 μm with, for example, a knife coater or the like on a substrate selected from variable substrates, and the coated surface of the substrate is irradiated by ultraviolet rays.

When the ultraviolet curable resin composition of the present invention is used as an additive, a method can be used wherein the resin composition is coated with, for example, a roll coater or the like on a substrate selected from variable substrates to form a coating having a thickness of 10 to 100 μm, then the coating surface thereof is irradiated with ultraviolet rays and adhesion of the substrate is conducted.

Moreover, when a transparent or translucent substrate is used, plural substrates can adhere to each other such that the ultraviolet curable resin composition is coated with, for example, a roll coater or the like on such a substrate selected from variable substrates to form a coating of an adhesive layer made of the resin composition having a thickness of 10 to 100 μm, the coating surface thereof is adhered to another substrate, and irradiation of ultraviolet rays is conducted from the side of the transparent or translucent substrate in order to cure the adhesive layer.

EXAMPLES

Hereinafter, the present invention is explained more concretely using Examples and Comparative Examples.

Synthetic Example 1

Preparation of 1,3-bis(3-ethyl-oxetane-3-yl methoxy)-propane-2-ol (Chemical formula 6)

818 parts by mass of 3-ethyl-3-hydroxy methyl oxetane and 90 parts by mass of sodium hydroxide were provided in a clean flask, the inside of the flask was cooled at 5° C., and then they were stirred and mixed.

In the aforementioned flask, 182 parts by mass of 1-chloro-2,3-epoxy propane were added dropwise over two hours while being stirred, and the reaction of 3-ethyl-3-hydroxy methyl oxetane and 1-chloro-2,3-epoxy propane was conducted for 18 hours to obtain a mixture including 1,3-bis(3-ethyl-oxetane-3-ylmethoxy)-propane-2-ol represented by the general formula (6). The synthesis of 1,3-bis(3-ethyl-oxetane-3-ylmethoxy)-propane-2-ol proceeds in accordance with the following chemical reaction formula.

Figure 2:
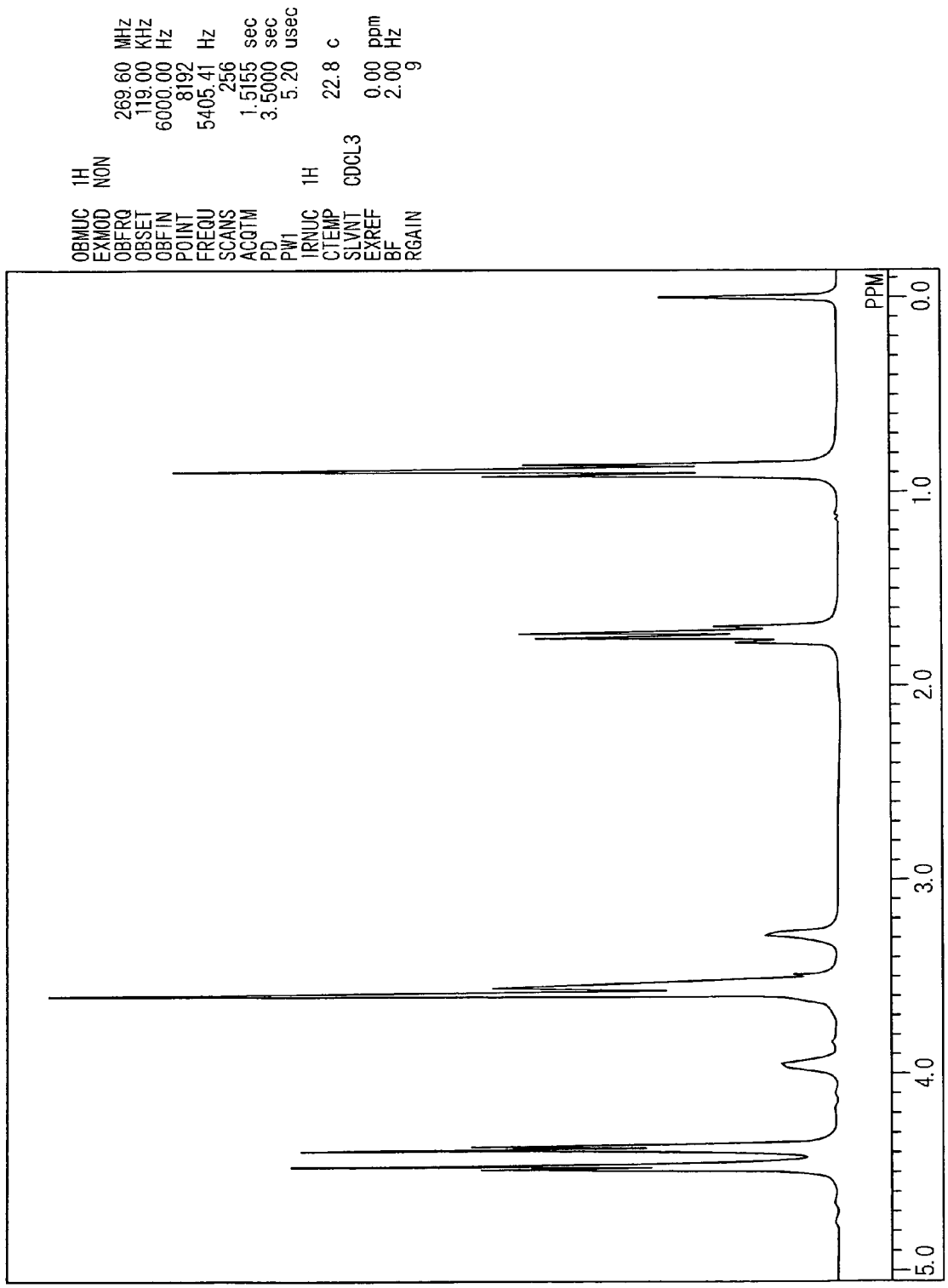
FIG. 2 is a figure wherein 1,3-bis-(3-ethyl-oxetane-3-yl-methoxy)-propane-2-ol obtained by Synthetic Example 1 was evaluated by H-NMR.

Subsequently, 1,3-bis(3-ethyl-oxetane-3-ylmethoxy)-propane-2-ol was isolated from the mixture due to distillation of the mixture conducted at the conditions of 140° C. and 20 mbar. Furthermore, identification of 1,3-bis(3-ethyl-oxetane-3-yl methoxy)-propane-2-ol was conducted using a nuclear magnetic resonance device (manufactured by Jeol Co., Ltd, EX-270) to evaluate C-NMR and H-NMR, and it was confirmed that said target compound was generated and isolated. The obtained results of C-NMR and H-NMR of 1,3-bis(3-ethyl-oxetane-3-ylmethoxy)-propane-2-ol generated are shown in FIGS. 1 and 2.

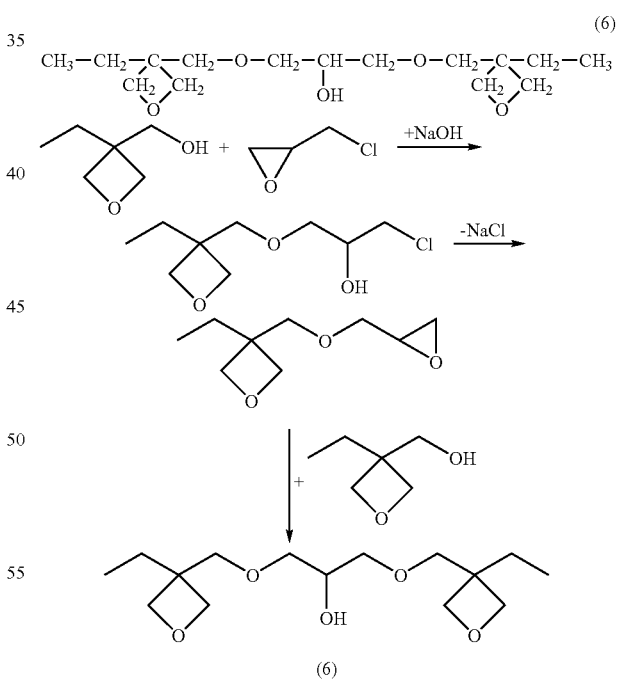

Synthetic Example 2

Synthetic Example of a Urethane Prepolymer (I)

496 parts by mass of polypropylene glycol (hydroxyl group equivalent=1000) were provided in a clean flask, and 186 parts by mass of 4,4'-diphenylmethane diisocyanate were further provided to the flask (isocyanate group equivalent/hydroxyl group equivalent=3.00). Then, they were reacted with each other for three hours at 90° C. while being stirred under a nitrogen atmosphere to generate a urethane prepolymer which has an isocyanate group at the terminal end thereof.

Subsequently, 318 parts by mass of 1,3-bis(3-ethyl-oxetane-3-yl methoxy)-propane-2-ol generated in the Synthetic Example 1 were added to the flask (isocyanate group equivalent/hydroxyl group equivalent=0.90), and then, the urethane prepolymer which has an isocyanate group at the terminal end and 1,3-bis (3-ethyl-oxetane-3-ylmethoxy)-propane-2-ol were reacted with each other for ten hours at 90° C. while being stirred under a nitrogen atmosphere to generate a urethane prepolymer (I). The number average molecular weight of the obtained urethane polymer (I) which was measured by size exclusion chromatography (SEC) was 2000. Furthermore, the obtained urethane prepolymer (I) had a structure wherein both terminal ends of the molecule have the structure represented by the aforementioned general formula (1) wherein a, b and c represent 0, $R_1$ and $R_2$ represent a methylene group, $R_3$ represents a hydrogen atom and $R_4$ and $R_5$ represent an ethyl group.

Synthetic Example 3

Synthetic Example of a Urethane Prepolymer (II)

496 parts by mass of polycaprolactone polyol (hydroxyl group equivalent=1000) were provided in a clean flask, and 186 parts by mass of 4,4'-diphenylmethane diisocyanate were further provided to the flask (isocyanate group equivalent/hydroxyl group equivalent=3.00). Then, they were reacted with each other for three hours at 90° C. while being stirred under a nitrogen atmosphere to generate a urethane prepolymer which has an isocyanate group at the terminal end thereof.

Subsequently, 318 parts by mass of 1,3-bis(3-ethyl-oxetane-3-yl methoxy)-propane-2-ol generated in the Synthetic Example 1 were added to the flask (isocyanate group equivalent/hydroxyl group equivalent=0.90), and the urethane prepolymer which has an isocyanate group at the terminal end and 1,3-bis (3-ethyl-oxetane-3-ylmethoxy)-propane-2-ol were reacted with each other for ten hours at 90° C. while being stirred under a nitrogen atmosphere to generate a urethane prepolymer (II). The number average molecular weight of the obtained urethane prepolymer (II) which was measured by size exclusion chromatography (SEC) was 2000. Furthermore, the obtained urethane prepolymer (II) had a structure wherein both terminal ends of the molecule have the structure represented by the aforementioned general formula (1) wherein a, b and c represent 0, $R_1$ and $R_2$ represent a methylene group, $R_3$ represents a hydrogen atom and $R_4$ and $R_5$ represent an ethyl group.

Synthetic Example 4

Synthetic Example of a Urethane Prepolymer (III)

649 parts by mass of polypropylene glycol (hydroxyl group equivalent=1000) were provided in a clean flask, and 244 parts by mass of 4,4'-diphenylmethane diisocyanate were further provided to the flask (isocyanate group equivalent/hydroxyl group equivalent=3.00). Then, they were reacted with each other for three hours at 90° C. while being stirred under a nitrogen atmosphere to generate a urethane prepolymer which has an isocyanate group at the terminal end thereof.

Subsequently, 107 parts by mass of a compound represented by the following structural formula (21) (3-ethyl-3-hydroxy methyl oxetane) were added to the flask (isocyanate group equivalent/hydroxyl group equivalent=0.90), and the urethane prepolymer which has an isocyanate group at the terminal end and the compound represented by the structural formula (21) were reacted with each other for three hours at 90° C. while being stirred under a nitrogen atmosphere to generate a urethane prepolymer (III). The number average molecular weight of the generated urethane prepolymer (III) which was measured by size exclusion chromatography (SEC) was 2000.

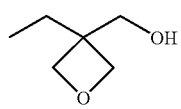

(21)

Synthetic Example 5

Synthetic Example of a Urethane Prepolymer (IV)

649 parts by mass of polypropylene glycol (hydroxyl group equivalent=1000) were provided in a clean flask, and 244 parts by mass of 4,4'-diphenylmethane diisocyanate were further provided to the flask (isocyanate group equivalent/hydroxyl group equivalent=3.00). They were reacted with each other for three hours at 90° C. while being stirred under a nitrogen atmosphere to generate a urethane prepolymer which has an isocyanate group at the terminal end thereof.

Subsequently, 108 parts by mass of glycidol were added to the flask (isocyanate group equivalent/hydroxyl group equivalent=0.90), and the urethane prepolymer which has an isocyanate group at the terminal end and glycidol were reacted with each other for four hours at 90° C. while being stirred under a nitrogen atmosphere to generate a urethane prepolymer (IV). The number average molecular weight of the generated urethane prepolymer (IV) which was measured by size exclusion chromatography (SEC) was 2000.

Synthetic Example 6

Synthetic Example of a Urethane Prepolymer (V)

601 parts by mass of polypropylene glycol (hydroxyl group equivalent=1000) were provided in a clean flask, and 227 parts by mass of 4,4'-diphenylmethane diisocyanate were further provided to the flask (isocyanate group equivalent/hydroxyl group equivalent=3.00). Then, they were reacted with each other for three hours at 90° C. while being stirred under a nitrogen atmosphere to generate a urethane prepolymer which has an isocyanate group at the terminal end thereof.

Subsequently, 172 parts by mass of a compound represented by the following structural formula (22) (3,4-epoxy tetrahydrobenzyl alcohol) were added to the flask (isocyanate group equivalent/hydroxyl group equivalent=0.90), and the urethane prepolymer which has an isocyanate group at the terminal end and the compound represented by the structural formula (22) were reacted with each other for three hours at 90° C. while being stirred under a nitrogen atmosphere to generate a urethane prepolymer (V). The number average molecular weight of the generated urethane prepolymer (V) which was measured by size exclusion chromatography (SEC) was 2000.

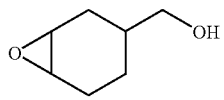

(22)

Example 1

100 parts by mass of the aforementioned urethane prepolymer (I) and 40 parts by mass of acetone were provided in a sealing type planetary mixer, and they were mixed and stirred until they were mixed uniformly.

Next, 5 parts by mass of CPI-100P (manufactured by San-Apro Ltd., a solution of diphenyl-4-(phenylthio) phenyl sulfonium hexafluorophosphate including 50% by mass of propylene carbonate as a solvent) was added to the mixer, and they were mixed and stirred to generate an ultraviolet curable resin composition.

Example 2

100 parts by mass of the aforementioned urethane prepolymer (II) and 40 parts by mass of acetone were provided in a sealing type planetary mixer, and they were mixed and stirred until they were mixed uniformly.

Next, 5 parts by mass of CPI-100P was added to the mixer, and mixed and stirred to generate an ultraviolet curable resin composition.

Example 3

50 parts by mass of the aforementioned urethane prepolymer (I) and 50 parts by mass of DENACOL EX-214L (manufactured by Nagase ChemteX Corporation, 1,4-butanediol diglycidyl ether) were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Example 4

50 parts by mass of the aforementioned urethane prepolymer (I) and 50 parts by mass of CYRACURE UVR-6110 (manufactured by Dow Chemical Japan Ltd., 3,4-epoxycyclohexylmethyl-3,4-epoxycyclohexyl carboxylate) were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Example 5

50 parts by mass of the aforementioned urethane prepolymer (I) and 50 parts by mass of ARON OXETANE OXT-221 (manufactured by Toagosei Co., Ltd., bis[1-ethyl(3-oxetanyl)]methyl ether) were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 1

100 parts by mass of the aforementioned urethane prepolymer (III) and 40 parts by mass of acetone were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 2

50 parts by mass of the aforementioned urethane prepolymer (III) and 50 parts by mass of CYRACURE UVR-6110 were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 3

50 parts by mass of the aforementioned urethane prepolymer (III) and 50 parts by mass of DENACOL EX-214L were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 4

50 parts by mass of the aforementioned urethane prepolymer (III) and 50 parts by mass of ARON OXETANE OXT-221 were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 5

100 parts by mass of the aforementioned urethane prepolymer (IV) and 40 parts by mass of acetone were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 6

50 parts by mass of the aforementioned urethane prepolymer (IV) and 50 parts by mass of CYRACURE UVR-6110 were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 7

100 parts by mass of the aforementioned urethane prepolymer (V) and 40 parts by mass of acetone were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Comparative Example 8

50 parts by mass of the aforementioned urethane prepolymer (V) and 50 parts by mass of CYRACURE UVR-6110 were provided in a sealing type planetary mixer, and they were mixed and stirred until they were mixed uniformly.

Next, 5 parts by mass of CPI-100P were added to the mixer, and they were mixed and stirred to generate an ultraviolet curable resin composition.

Curability and flexibility of the ultraviolet curable resin compositions of Examples 1 to 5 and Comparative Examples 1 to 8 were evaluated in accordance with the methods described below.

(Evaluation of Curability)

Ultraviolet curable resin compositions described in Example 1, Example 2, Comparative Example 1, Comparative Example 5 and Comparative Example 7 were coated on a polypropylene plate with an applicator so that the thickness of the coated film became 100 μm, and each polypropylene plate was provided at the environment of 23° C. for five minutes to volatilize acetone in the coated resin composition.

Subsequently, ultraviolet irradiation was conducted to the ultraviolet curable resin compositions with the conveyor type ultraviolet irradiation device CSOT-40 (manufactured by Japan Storage Battery Co., Ltd., high-pressure mercury lamp was used, intensity: 120 W/cm) such that ultraviolet dose became 700 to 800 mJ/cm$^2$. Then, the irradiated ultraviolet curable resin compositions were allowed to be left for seven days at a temperature of 23° C. and a humidity of 50% RH to produce films.

Here, the ultraviolet dose was based on the value measured at the wavelength range from 300 to 390 nm using the UV CHECKER UVR-N1 (manufactured by Japan Storage Battery Co., Ltd.).

Subsequently, about 1 g of each cured film of the resin composition was cut off, and the initial mass (g) of the film was measured with an electronic precision balance.

Next, the films wherein the initial mass had been measured were immersed in 100 g of ethyl acetate for 24 hours at a condition of 50° C. After immersion was completed, the films immersed in ethyl acetate were dried for one hour at a condition of 107° C., and the mass (g) of the dried films after immersion were measured with the electronic precision balance.

Gel fraction (mass %) was calculated based on the following formula wherein the measured initial mass and the measured mass after immersion of the films were used.

Gel fraction (mass %)=(mass after immersion of a film (g)/initial mass (g) of a film)×100

Ultraviolet curable resin compositions described in Examples 3 to 5, Comparative Examples 2 to 4, Comparative Example 6 and Comparative Example 8 were coated on a polypropylene plate with an applicator so that the thickness of the coated film became 100 μm.

Subsequently, ultraviolet irradiation was conducted to the ultraviolet curable resin compositions with the conveyor type ultraviolet irradiation device CSOT-40 (manufactured by Japan Storage Battery Co., Ltd., high-pressure mercury lamp was used, intensity: 120 W/cm) such that ultraviolet dose became 700 to 800 mJ/cm$^2$. Then, the irradiated ultraviolet curable resin compositions were allowed to be left for seven days at a temperature of 23° C. and a humidity of 50% RH to produce films.

Next, about 1 g of each film of the ultraviolet curable resin compositions was cut off, and the initial mass (g) of the cut film was measured with the electronic precision balance.

Subsequently, the films wherein the initial mass thereof had been measured were immersed in 100 g of ethyl acetate for 24 hours at a condition of 50° C. After the immersion was completed, the films immersed in ethyl acetate were dried for one hour at a condition of 107° C., and the mass (g) of the dried films after immersion were measured with the electronic precision balance.

Gel fraction (mass %) was calculated based on the aforementioned formula wherein the measured initial mass and the measured mass after immersion of the films were used.

(Evaluation Criteria of Curability)

When the ultraviolet curable resin composition has 90% by mass or more of the gel fraction calculated according to the above method, the resin composition can be determined so that the composition is excellent in curability and is preferable for practical use.

(Evaluation Method of Flexibility)

Films made of each ultraviolet curable resin composition were generated by the method similar to that described in the aforementioned section of the "evaluation of curability". Each film was bent with both hands in the range of 1 to 100° angle, and whether or not cracks were formed was evaluated in accordance with the following criteria.

(Evaluation Criteria)

○ . . . No crack was generated even when a film was bent to a 90° angle or more.

x . . . Cracks were generated when a film was bent to a 1° angle or more but less than a 90° angle.

* . . . Evaluation cannot be conducted since a film was not formed by the reason that curing of a resin composition does not proceed sufficiently.

TABLE 1

|  | Example 1 | Example 2 | Example 3 | Example 4 | Example 5 |
|---|---|---|---|---|---|
| Urethane prepolymer (A) | I | II | I | I | I |
| Parts by mass | 100 | 100 | 50 | 50 | 50 |
| Cationic-photopolymerization initiator (B) | CPI-100P | CPI-100P | CPI-100P | CPI-100P | CPI-100P |
| Part by mass | 5 | 5 | 5 | 5 | 5 |
| Cationic-polymerizable compound (C) | — | — | EX-214L | UVR-6110 | OXT-221 |
| Parts by mass | — | — | 50 | 50 | 50 |
| Solvent | Acetone | Acetone | — | — | — |
| Parts by mass | 40 | 40 | — | — | — |
| Curability Gel fraction (mass %) | 95 | 93 | 91 | 90 | 96 |
| Flexibility | ○ | ○ | ○ | ○ | ○ |

TABLE 2

| | Comparative Example 1 | Comparative Example 2 | Comparative Example 3 | Comparative Example 4 |
|---|---|---|---|---|
| Urethane prepolymer (A) | III | III | III | III |
| Parts by mass | 100 | 50 | 50 | 50 |
| Cationic-photopolymerization initiator (B) | CPI-100P | CPI-100P | CPI-100P | CPI-100P |
| Parts by mass | 5 | 5 | 5 | 5 |
| Cationic-polymerizable compound (C) | — | UVR-6110 | EX-214L | OXT-221 |
| Parts by mass | — | 50 | 50 | 50 |
| Solvent | Acetone | — | — | — |
| Parts by mass | 40 | — | — | — |
| Curability Gel fraction (mass %) | 1 | 11 | 14 | 23 |
| Flexibility | * | * | * | * |

TABLE 3

| | Comparative Example 5 | Comparative Example 6 | Comparative Example 7 | Comparative Example 8 |
|---|---|---|---|---|
| Urethane prepolymer (A) | IV | IV | V | V |
| Parts by mass | 100 | 50 | 100 | 50 |
| Cationic-photopolymerization initiator (B) | CPI-100P | CPI-100P | CPI-100P | CPI-100P |
| Parts by mass | 5 | 5 | 5 | 5 |
| Cationic-polymerizable compound (C) | — | UVR-6110 | — | UVR-6110 |
| Parts by mass | — | 50 | — | 50 |
| Solvent | Acetone | — | Acetone | — |
| Parts by mass | 40 | — | 40 | — |
| Curability Gel fraction (mass %) | 0 | 6 | 0 | 63 |
| Flexibility | * | * | * | x |

(Explanation of Abbreviations Shown in Tables 1 to 3)

EX-214L: 1,4-butanediol diglycidyl ether (manufactured by Nagase ChemteX Corporation, trade name: DENACOL, epoxy group equivalent weight=120 g)

UVR-6110: 3,4-epoxycyclohexylmethyl-3,4-epoxycyclohexyl carboxylate (manufactured by Dow Chemical Japan Ltd., trade name: CYRACURE, epoxy group equivalent weight=137 g)

OXT-221: bis[1-ethyl(3-oxetanyl)]methyl ether (manufactured by Toagosei Co., Ltd., trade name: ARON OXETANE, oxetanyl group equivalent weight=107.2 g)

CPI-100P: a solution of diphenyl-4-(phenylthio) phenyl sulfonium hexafluorophosphate, which includes 50% by mass of propylene carbonate as a solvent (manufactured by San-apro.cojp).

INDUSTRIAL APPLICABILITY

The ultraviolet curable resin composition of the present invention has excellent curability, can form a cured product which has excellent flexibility, and has excellent adhesiveness with respect to a substrate material. Therefore, the resin composition of the present invention is applicable to various fields, and can be used for, for example, an adhesive, a pressure sensitive adhesive, a sealing agent, a resist, a coating agent, an ink and a vehicle for inks and the like.

The invention claimed is:

1. An ultraviolet curable resin composition, which comprises a cationic photopolymerization initiator (B) and a urethane prepolymer (A) having any number of a structure represented by the general formula (1) in any position;

$$R_4-\underset{\underset{O}{\overset{CH_2}{\diagdown}\overset{CH_2}{\diagup}}}{C}-CH_2-(O-R_6)_b-O-R_1-\underset{\underset{(CH_2)_a-O}{|}}{\overset{R_3}{\underset{|}{C}}}-R_2-O-(R_7-O)_c-CH_2-\underset{\underset{O}{\overset{CH_2}{\diagdown}\overset{CH_2}{\diagup}}}{C}-R_5 \quad (1)$$

wherein $R_1$ and $R_2$ each independently represent an alkylene group, $R_3$, $R_4$ and $R_5$ each independently represent an alkyl group or hydrogen atom, $R_6$ and $R_7$ each independently represent an alkylene group having 2 to 4 carbon atoms, a represents 0 or 1, and b and c each independently represent an integer of 0 to 10.

2. The ultraviolet curable resin composition according to claim 1, wherein the urethane prepolymer (A) has the structure represented by the general formula (1) at the both terminal ends of the prepolymer (A).

3. The ultraviolet curable resin composition according to claim 1, wherein the general formula (1) of the urethane prepolymer (A) has a structure wherein a represents 0, b and c each independently represent an integer of 0 to 4, $R_1$ and $R_2$ represent a methylene group, $R_3$ represents a hydrogen atom, $R_4$, and $R_5$ represent an ethyl group, and $R_6$ and $R_7$ each independently represent an alkylene group having 2 to 4 carbon atoms.

4. The ultraviolet curable resin composition according to claim 1, wherein the general formula (1) of the urethane prepolymer (A) has a structure wherein a, b and c represent 0, $R_1$ and $R_2$ represent a methylene group, $R_3$ represents a hydrogen atom, and $R_4$, and $R_5$ represent an ethyl group.

5. The ultraviolet curable resin composition according to claim 1, wherein
the urethane prepolymer (A) is a compound generated by reacting a compound (b) represented by the general formula (2) and a urethane prepolymer (a) which has an isocyanate group at the terminal end and is produced by reacting polyol (a1) with polyisocyanate (a2);

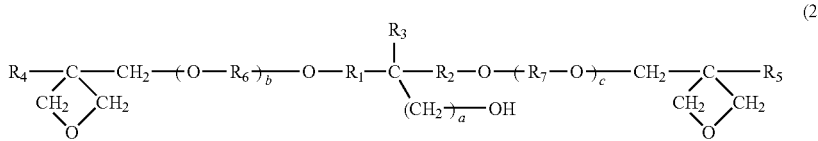

(2)

wherein $R_1$ and $R_2$ each independently represent an alkylene group; $R_3$, $R_4$ and $R_5$ each independently represent an alkyl group or a hydrogen atom; $R_6$ and $R_7$ each independently represent an alkylene group having 2 to 4 carbon atoms; a represents 0 or 1; and b and c each independently represent an integer of 0 to 10.

6. The ultraviolet curable resin composition according to claim 1, wherein the resin composition further comprises a cationic-polymerizable compound (C) which is different from the urethane prepolymer (A).

7. The ultraviolet curable resin composition according to claim 6, wherein the cationic-polymerizable compound (C) is an oxetane compound including 2 to 4 oxetane ring structures.

8. An adhesive made of the ultraviolet curable resin composition according to claim 1.

9. An adhesive made of the ultraviolet curable resin composition according claim 2.

10. An adhesive made of the ultraviolet curable resin composition according to claim 3.

11. An adhesive made of the ultraviolet curable resin composition according to claim 4.

12. An adhesive made of the ultraviolet curable resin composition according to claim 5.

13. An adhesive made of the ultraviolet curable resin composition according to claim 6.

14. An adhesive made of the ultraviolet curable resin composition according to claim 7.

* * * * *